(12) United States Patent
Yang

(10) Patent No.: US 6,643,827 B1
(45) Date of Patent: Nov. 4, 2003

(54) SYMBOLIC MODEL CHECKING WITH DYNAMIC MODEL PRUNING

(75) Inventor: Jin Yang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 497 days.

(21) Appl. No.: 09/677,262

(22) Filed: Sep. 30, 2000

(51) Int. Cl.$^7$ .............................................. G06F 17/50
(52) U.S. Cl. .............................................. 716/2; 716/3
(58) Field of Search ........................................ 716/1–4

(56) References Cited

U.S. PATENT DOCUMENTS

| | | | |
|---|---|---|---|
| 5,469,367 A | 11/1995 | Puri et al. ...................... | 716/18 |
| 5,491,639 A | 2/1996 | Filkorn .......................... | 716/5 |
| 5,594,656 A | 1/1997 | Tamisier ....................... | 703/13 |
| 5,754,454 A | 5/1998 | Pixley et al. ................ | 702/123 |
| 5,768,498 A | 6/1998 | Boigelot et al. ............... | 714/39 |
| 5,870,590 A * | 2/1999 | Kita et al. ..................... | 716/4 |
| 5,905,977 A | 5/1999 | Goubault ...................... | 706/46 |
| 5,937,183 A | 8/1999 | Ashar et al. .................. | 703/14 |
| 6,026,222 A | 2/2000 | Gupta et al. .................... | 716/5 |
| 6,035,109 A | 3/2000 | Ashar et al. .................... | 716/3 |
| 6,086,626 A | 7/2000 | Jain et al. ...................... | 716/5 |
| 6,131,078 A | 10/2000 | Plaisted .......................... | 703/2 |
| 6,148,436 A | 11/2000 | Wohl ............................ | 716/18 |
| 6,185,516 B1 | 2/2001 | Hardin et al. .................. | 703/2 |
| 6,209,120 B1 | 3/2001 | Kurshan et al. ............... | 716/5 |
| 6,247,165 B1 | 6/2001 | Wohl et al. .................... | 716/5 |
| 6,292,916 B1 | 9/2001 | Abramovici et al. ........ | 714/736 |
| 6,301,687 B1 | 10/2001 | Jain et al. ...................... | 716/3 |
| 6,308,299 B1 | 10/2001 | Burch et al. ................... | 716/4 |
| 6,321,186 B1 | 11/2001 | Yuan et al. .................... | 703/15 |
| 6,339,837 B1 | 1/2002 | Li .................................. | 716/5 |
| 6,484,134 B1 * | 11/2002 | Hoskote ....................... | 703/14 |

OTHER PUBLICATIONS

Berezin, S. et al, "A Compositional Proof System for the Modal μ–Calculus and CCS," *Technical Report CMU–CS–97–105, Carnegie Mellon University*, Jan. 15, 1997.

Berezin, S. et al, "Model Checking Algorithms for the μ–Calculus," *Technical Report CMU–CS–96–180, Carnegie Mellon University*, Sep. 23, 1996.

Bryant, R. E. et al, "Formal Hardware Verification by Symbolic Ternary Trajectory Evaluation," $28^{th}$ *ACM/IEEE Design Automation Conference*, Paper 24.2, 1991, pp. 397–402.

(List continued on next page.)

*Primary Examiner*—Matthew Smith
*Assistant Examiner*—Sun James Lin
(74) *Attorney, Agent, or Firm*—Blakely, Sokoloff, Taylor & Zafman LLP

(57) ABSTRACT

Formal verification methods provide for improved efficiency of popular binary decision diagram (BDD) based algorithms. A lazy pre-image computation method builds new transition relation partitions on-demand for relevant internal variables of a state predicate, and conjoins only next state relations for relevant internal variables to a pre-image including the state predicate. A lazy fixpoint computation method makes iterative use of lazy pre-image computation to compute conditions that must be satisfied to produce a given set of states. A forward assumption propagation method generates assumptions to characterize a set of interesting states for a property being evaluated at one or more evaluation stages. A dynamic transition relation reduction improves the efficiency for symbolic model checking by reducing transition relations under assumptions dynamically generated from properties being evaluated. These methods provide symbolic model checking of circuits and other finite state systems previously too large to be completed successfully using BDD based algorithms.

34 Claims, 14 Drawing Sheets

OTHER PUBLICATIONS

Bryant, R. E., "Binary Decision Diagrams & Beyond," Tutorial at ICCAD '95, *Carnegie Mellon University, 1995.*

Burch, J. R. et al, "Representing Circuits More Efficiently in Symbolic Model Checking," *28th ACM/IEEE Design Automation Conference,* Paper 24.3, 1991, pp. 403–407.

Burch, J. R. et al, "Sequential Circuit Verification Using Symbolic Model Checking," *27th ACM/IEEE Design Automation Conference,* Paper 3.2, 1990, pp. 46–51.

Campos, S., "Real–Time Symbolic Model Checking for Discrete Time Models," *Technical Report CMU–CS–94–146, Carnegie Mellon University,* Pittsburgh, PA, May 2, 1994.

Chan, W. et al, Combining Constraint Solving and Symbolic Model Checking for a Class of Systems with Non–linear Constraints, *Computer Aided Verification, 9th International Conference, CAV '97 Proceedings* (O. Grumberg, Editor), Lecture Notes in Computer Science 1254, pp. 316–327, Haifa, Israel, Jun. 1997. Springer–Verlag (Revised in Dec. 1998).

Chen, Y. et al, "PBHD: An Efficient Graph Representation for Floating Point Circuit Verification," *Technical Report CMU–CS–97–134, Carnegie Mellon University,* May 1997.

Cheung, S. et al, "Checking Safety Properties Using Compositional Reachability Analysis," *ACM Transactions on Software Engineering and Methodology,* vol. 8, No. 1, Jan. 1999, pp. 49–78.

Chiodo, M. et al, "Automatic Compositional Minimization in CTL Model Checking," *Proceedings of 1992 IEEE/ACM International Conference on Computer–Aided Design,* Nov., 1992, pp. 172–178.

Chou, C., "The Mathematical Foundation of Symbolic Trajectory Evaluation," *International Conference on Computer–Aided Verification(CAV'99),* Trento, Italy, Jul. 1999 pp. 196–207, Proceedings of CAV'99, Lecture Notes in Computer Science #1633 (Editors: Nicolas Halbwachs & Doron Peled), Springer–Verlog, 1999.

Clarke, E. et al, "Another Look at LTL Model Checking," *Technical Report CMU–CS–94–114, Carnegie Mellon University,* Feb. 23, 1994.

Clarke, E. et al, "Combining Symbolic Computation and Theorem Proving: Some Problems of Ramanujan," *Technical Report CMU–CS–94–103, Carnegie Mellon University,* Jan. 1994.

Clarke, E. M. et al, "Formal Methods: State of the Art and Future Directions," *ACM Computing Surveys,* vol. 28, No. 4, Dec. 1996, pp. 626–643.

Clarke, E. M. et al, "Model Checking and Abstraction," *Proceedings of the 19th ACM SIGPLAN–SIGACT Symposium on Principles of Programming Languages,* Feb. 1992, pp. 343–354.

Clarke, E. M. et al, "Model Checking and Abstraction," *ACM Transactions on Programming Languages and Systems,* vol. 16, No. 5, Sep. 1994, pp. 1512–1542.

Grumberg, O., "Model Checking and Modular Verification," *ACM Transactions On Programming Languages and Systems,* vol. 16, No. 3, May 1994, pp. 843–871.

Jackson, D., "Exploiting Symmetry in the Model Checking of Relational Specifications," *Technical Report CMU–CS 94–219, Carnegie Mellon University,* Dec. 1994.

Jain, A. et al, "Verifying Nondeterministic Implementations on Determinist Systems," *Lecture Notes in Computer Science, Formal Methods in Computer Aided–Design,* pp. 109–125, Nov. 1996.

Jain, A., "Formal Hardware Verification by Symbolic Trajectory Evaluation," *Carnegie Mellon University Ph.D. Dissertation,* Jul. 1997.

Jain, S. et al, "Automatic Clock Abstraction from Sequential Circuits," *Proceedings of the 32nd ACM/IEEE Conference on Design Automation,* Jan. 1995.

Jha, S. et al, "Equivalence Checking Using Abstract BBDs," *Technical Report CMU–CS–96–187, Carnegie Mellon University,* Pittsburgh, PA, Oct. 29, 1996.

Kern, C. et al, "Formal Verification In Hardware Design: A Survey," *ACM Transactions on Design Automation of Electronic Systems,* vol. 4, No. 2, Apr. 1999, pp. 123–193.

Kurshan, R. et al, "Verifying Hardware in its Software Context," *Proceedings of the 19th ACM SIGPLAN–SIGACT Symposium on Principles of Programming Languages,* Feb. 1992, pp. 742–749.

Nelson, K. L. et al, "Formal Verification of a Superscalar Execution Unit," *34th Design Automation Conference,* Jun. 1997.

Tuya, J. et al, "Using a Symbolic Model Checker for Verify Safety Properties in SA/RT Models," *Proceeding of the 5h European Software Engineering Conference, Lecture Notes in Computer Science,* vol. 989, Springer–Verlag, Berlin, 1995, pp. 59–75.

Velev, M. N., "Efficient Modeling of Memory Arrays in Symbolic Simulations," *Proceedings of Computer–Aided Verification,* Jun. 1997.

Wing, J. M. et al, "A Case Study in Model Checking Software Systems," *Technical Report CMU–CS–96–124, Carnegie Mellon University,* Pittsburgh, PA, Apr. 1996.

Yeh, W. et al, "Compositional Reachability Analysis Using Process Algebra," *28th ACM/IEEE Design Automation Conference,* 1991.

\* cited by examiner

FIG. 4b

| # of transitions | Front | Transition Relation | Lazy Pre-image | Fixpoint |
|---|---|---|---|---|
| 0 | e | [ ] | | e<br><br>420 |
| 1 | c AND NOT e | [ N(e) = e OR c ] | e OR c | e OR c<br><br>421 |
| 2 | ∅ | [ N(e) = e OR c<br>N(c) = c AND a ] | (c AND a) AND NOT (e OR c) | e OR c<br><br>422 |

FIG. 5c

| Iteration | Assumption | Sub-property |
|---|---|---|
| 0 | 1 <br><br> 540 | $a \Rightarrow (b \Rightarrow X(Xf))$ <br><br> 530 |
| 1 | a <br><br> 541 | $b \Rightarrow X(Xf)$ <br><br> 531 |
| 2 | $a \wedge b$ <br><br> 542 | $X(Xf)$ <br><br> 532 |
| 3 | $Post(a \wedge b)) = d$ <br><br> 543 | $Xf$ <br><br> 533 |
| 4 | $Post(Post(a \wedge b)) = 1$ <br><br> 544 | $f$ <br><br> 534 |

FIG. 7b

| # of iteration | Assum | Reduced Transition Relation | Sub-property | State Predicate |
|---|---|---|---|---|
| 4 | 1 | [ ] | f | f<br><br>724 |
| 3 | d | [N(f) = NOT c] | Xf | NOT c<br><br>723 |
| 2 | a AND b | [ N(c) = c ] | X(Xf) | NOT c<br><br>722 |
| 1 | a | | b ⇒ X(Xf) | NOT b OR NOT c<br><br>721 |
| 0 | 1 | | a ⇒(b ⇒ X(Xf)) | NOT a OR NOT b OR NOT c<br><br>720 |

SYMBOLIC MODEL CHECKING WITH DYNAMIC MODEL PRUNING

FIELD OF THE INVENTION

This invention relates generally to automated design verification, and in particular to more efficient use of binary decision diagrams to perform automated symbolic model checking for very large scale integrated circuit designs and other finite state systems.

BACKGROUND OF THE INVENTION

Modern design of very large-scale integrated circuits often involves years of research and the efforts of hundreds of engineers. Automated formal verification methods are an essential part of the design effort, reducing errors, lost time and risk to financial investment. Formal verification involves building a finite model of a system as a set of states and state transitions and checking that a desired property holds in the model. An exhaustive search of all possible states of the model may be performed in order to verify a desired property.

As the size and complexity of designs increase, much effort is expended to improve the efficiency of automated formal verification methods. One technique used in symbolic model checking to improve efficiency is to employ binary decision diagrams (BDDs). A BDD is a directed acyclic graph that represents a Boolean expression. For each Boolean variable, there are two outgoing edges representing true or false assignments to the variable. The use of BDDs permits computation times, which are some polynomial function of the number of expression variables. Alternative representations such as clauses or truth tables require execution times, which are some exponential function of the number of expression variables. Therefore, use of BDDs has been popular in the formal verification community since the late 1980's.

BDDs, however, are not without drawbacks. The ordering of variables is critical to an efficient use of BDDs. Poor variable ordering can increase a BDDs size and cause exponential execution times. One method for symbolic model checking using BDDs comes from Carnegie Mellon University and is known as Symbolic Model Verifier (SMV).

Alternatively SMV uses a well known heuristic based procedure named simplify_assuming that is aimed at reducing BDD representations by simplifying a predicate using an invariant assumption but introduces a proof obligation, which must also be verified. Since the assumption is static it may also be ineffective in pruning a model.

Over the years, techniques have been developed to improve performance and capacity of BDD-based algorithms. One technique is called Cone of Influence (COI) reduction. In COI reduction, an abstraction is built for a circuit model consisting of next state functions only for variables in the dependency closure of variables of interest in the circuit specification. One drawback is that all variables in the dependency closure do not necessarily influence the variables of interest in the circuit specification. A second drawback is that the abstraction that is built and used for each model-checking step may include portions that are useful in only a few of the model checking steps. Therefore needless extra computations are potentially performed, resulting in little benefit to the circuit verification.

Some methods have attempted to improve upon COI reduction by starting from a small portion of the dependency closure and extending the portion only when model checking fails to produce a satisfactory result. But these techniques also perform unnecessary computations on portions that are not relevant to the particular model-checking step being performed.

One method called the bounded cone of influence (BCOI) was proposed by A. Biere et al for symbolic model checking without BDDs [A. Biere, E. Clark, R. Raimi, and Y. Zhu; Verifying safety properties of a PowerPC™ microprocessor using symbolic model checking without BDDs; CAV'99; 1999]. However, even the BCOI method potentially includes irrelevant variables in the abstraction it builds, and the technique is not applicable to improve the widely used BDD-based approaches.

BRIEF DESCRIPTION OF THE DRAWINGS

The present invention is illustrated by way of example and not limitation in the figures of the accompanying drawings.

FIG. 4b shows an example of a lazy fixpoint computation for a circuit.

FIG. 5c shows an example of producing and propagating assumptions from sub-properties to be evaluated.

FIG. 7b an example of dynamically pruning a transition relation for a model under assumptions generated from sub-properties to be evaluated.

DETAILED DESCRIPTION

Embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention is to be measured only in terms of the claims.

Methods for formal verification of circuits and other finite-state systems are disclosed herein, for providing improved efficiency and capacity of popular binary decision diagram (BDD) based algorithms. For one embodiment of a lazy pre-image computation, a method is disclosed that builds new transition relation partitions on-demand only for relevant next internal variables of a state predicate, and conjoins only next state relations for relevant next internal variables to a pre-image including the state predicate. For one embodiment of a lazy fixpoint computation, a method is disclosed that makes iterative use of lazy pre-image computation to compute conditions that must necessarily be satisfied to produce a given set of states. For one embodiment of forward assumption propagation, a method is disclosed that generates assumptions to characterize a set of interesting states for sub-properties of the property being evaluated at one or more evaluation stages. For one embodiment of a dynamic transition relation pruning technique, a method is disclosed that improves the efficiency for symbolic model checking computations by pruning transition relations under assumptions dynamically generated from the properties being evaluated, thereby providing means to handle very large scale integrated circuits and other finite state systems of problematic complexity for prior methods. The teachings of these disclosed methods provide for symbolic model checking of circuits and other finite state systems previously too large to be completed successfully using BDD based algorithms.

Figure 1:
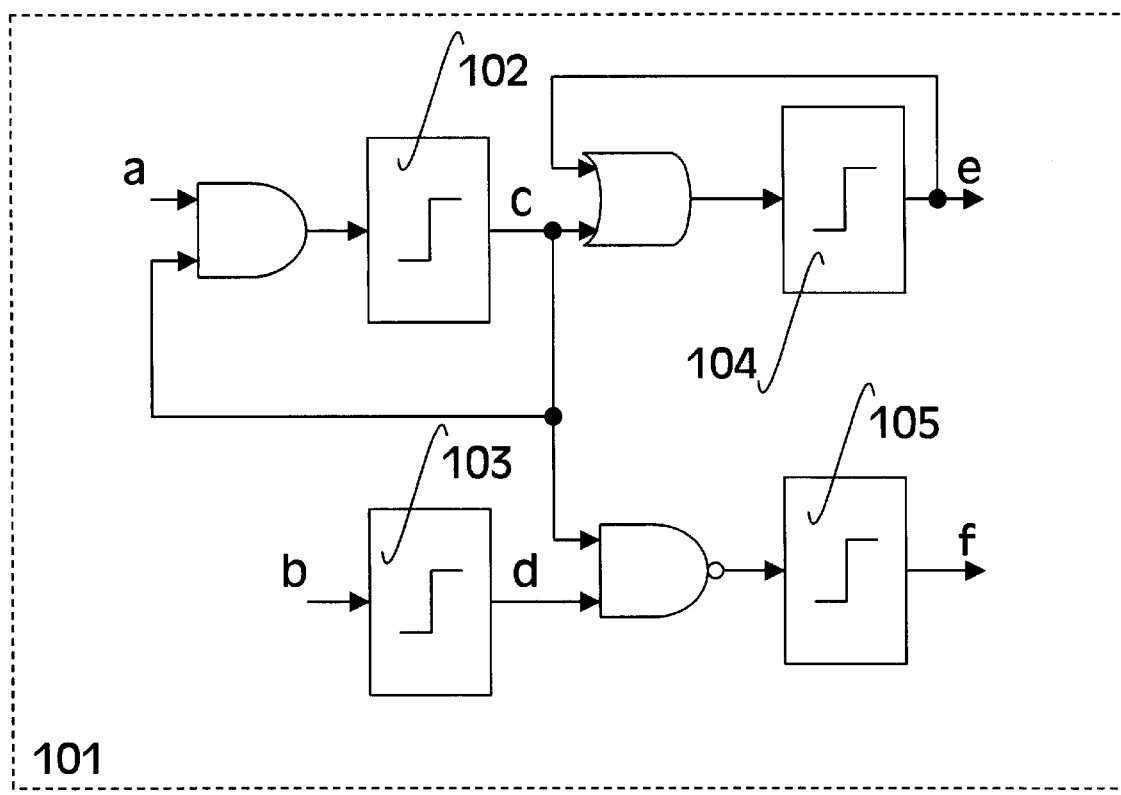
FIG. 1 illustrates an example of a circuit.

FIG. 1 illustrates an example of a circuit 101 having internal state variables c, d, e and f; and input variables a and b. According to the logical combination of inputs to memory element 102, the value of internal state variable c at its next transition can be determined to be the value of the Boolean expression a AND c. From the logical combination of inputs to memory element 103, the value of internal state variable d at its next transition can be determined to be the value of the input variable b. From the logical combination of inputs to memory element 104, the value of internal state variable e at its next transition can be determined to be the value of the Boolean expression c OR e. Finally, from the logical combination of inputs to memory element 105, the value of internal state variable f at its next transition can be determined to be the value of the Boolean expression c NAND d.

A model of a circuit or other finite state system can be formally defined as: a nonempty finite set of Boolean variables, $V = V_S \mathring{A} V_I$, consisting of a union V of internal state variables $V_S$ with input variables $V_I$; and a next state function $N(v)$ for each v in $V_S$, which is an assignment mapping of internal state variables according to Boolean (true or false) valued expressions on V called state predicates.

For one embodiment, a model may be represented as a nonempty transition relation, R, on state predicate pairs, where (S1, S2) is an element of the transition relation, R, if there exists a transition in the finite state system from a state satisfying predicate S1 to state satisfying predicate S2. R is also referred to as a model of the finite state system.

A partitioned transition relation, R, on a partitioning of the internal state variables $\{V1, V2, \ldots, Vk\}$ has the implicitly conjoined form:

$$R(V, V') = R1(V, V1') \text{ AND } R2(V, V2') \ldots \text{ AND } Rk(V, Vk')$$

where the ith partition is $Ri(V,Vi') = \text{AND}_{\text{for all } v' \text{ in } Vi'} (v'=N(v))$. The assertion $v'=N(v)$ is called the next state relation for v and v' is a copy of v to record the value taken on by v at the next transition.

The set of states, S, may be represented using a Boolean state predicate S(V). Operations on sets may be carried out as algebraic manipulations of state predicates. The set of states that can move to S in one transition is called the pre-image of S and written $$Pre(S(V)) = \exists V'.[\text{AND}_{\text{for all } v' \text{ in } V_{S'}}(v'=N(v)) \text{ AND } S(V')].$$

An existential operation $\exists V'.[S(V')]$ represents a quantification of state predicate S(V') over the variables in V'. Typically, in order to more efficiently use computation resources, the operation of computing the pre-image of a set of states is carried out as a relation product of state predicates using early variable quantification for partitioned transition relations, thereby permitting staged reductions of Boolean expressions, as follows:

$$Pre(S(V)) = \exists V1'.[R1(V, V1') \text{ AND } ($$
$$\exists V2'.[R2(V, V2') \text{ AND } ($$
$$\ldots$$
$$\exists Vk.[Rk(V, Vk') \text{ AND } ($$
$$\exists Vl'.S(V')\,)]$$
$$\ldots)]$$
$$)].$$

An alternative definition for a model can be set forth as a pair of induced transformers, Pre and Post, such that Pre(S2) includes S1 and Post(S1) includes S2 if (S1, S2) is an element of R. In other words, the Pre transformer identifies any states satisfying predicate S, for which there exists a transition to some state satisfying predicate S'. Pre is called a pre-image transformer. The Post transformer identifies any states satisfying predicate S', for which there exists a transition from some state satisfying predicate S. Post is called a post-image transformer.

One drawback of a typical pre-image computation is that it involves the entire partitioned transition relation. But S(V) may involve only a few variables. Consequently, not all next state relations are relevant in any particular invocation of a pre-image computation.

Figure 2A:
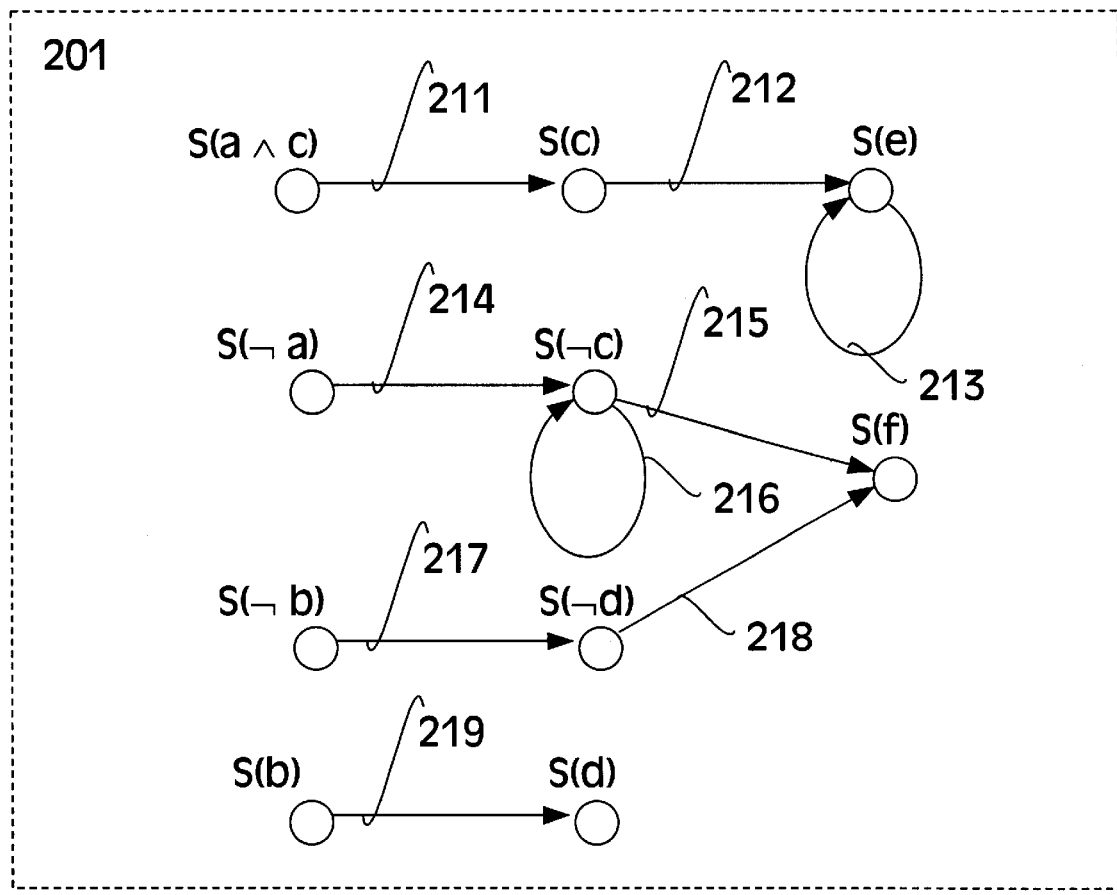
FIG. 2a graphically illustrates a transition relation for a circuit.

For example, FIG. 2a graphically illustrates a possible transition relation 201 for circuit 101 having $V_S = \{c, d, e, f\}$ and $V_I = \{a, b\}$. The next state function for variable c is N(c)=a AND c. Therefore, in order for the circuit to reach a state, S(c), where c=1 it must have made transition 211 from a state S(a AND c) where a=1 and c=1. The next state function for variable d is N(d)=b. Therefore, in order for the circuit to reach a state, S(d), where d=1 it must have made transition 219 from a state S(b) where b=1. The next state function for variable e is N(e)=e OR c. Therefore, in order for the circuit to reach a state, S(e), where e=1 it must have made transition 212 from a state S(c) where c=1 or it must have made transition 213 from a state S(e) where e=1. The next state function for variable f is N(f)=d NAND c.

Therefore, in order for the circuit to reach a state, S(f), where f=1 it must have made transition 215 from a state S(NOT c) where c=0 or it must have made transition 218 from a state S(NOT d) where d=0.

Computing all states reachable to S(e) in two or more transitions includes the next state function for variable c, which has already been shown as N(c)=a AND c represented by transition 211. The next state function for variable NOT c is N(NOT c)=NOT(a AND c)=(NOT a) OR (NOT c). Therefore, in order for the circuit 101 to reach a state, S(NOT c), where c=0 it must have made transition 214 from a state S(NOT a) where a=0 or it must have made transition 216 from a state S(NOT c) where c=0. The next state function for variable NOT d is N(NOT d)=NOT b. Therefore, in order for the circuit to reach a state, S(NOT d), where d=0 it must have made transition 217 from a state S(NOT b) where b=0.

For a given state predicate, an invocation of a pre-image computation that uses transition relation 201 may result in computations that are not relevant to that state predicate. For one embodiment, a lazy pre-image computation is disclosed which provides a relevant transition relation abstraction for each pre-image computation according to the state predicate of the invocation. Such a lazy pre-image computation may be performed for a state predicate S(W), where W is contained in V and $W_S'$ is the set of next internal variables in the set of next variables W', as follows:

$$Pre(S(W)) = \exists W'.[AND_{for\ all\ v'\ in\ W_S'}(v'=N(v)) \text{ AND } S(W')].$$

The approach provided by the lazy pre-image computation disclosed above differs from previous COI reduction approaches in that it is not statically derived from a model specification and then used throughout. Instead, it dynamically provides an abstraction for each pre-image computation that is relevant to the particular state predicate associated with the invocation. Accordingly, lazy pre-image computation provides for greater efficiency and capacity improvements in popular BDD-based symbolic model checking methods than previously used pre-image computation methods.

For example, the lazy pre-image of a state predicate S(e) for circuit 101 where e=1 can be computed:

$$Pre(S(e)) = \exists e'.[(e' = N(e)) \text{ AND } S(e')].$$
$$= \exists e'.[(e' = e \text{ OR } c) \text{ AND } e'].$$
$$= (e \text{ OR } c).$$

Figure 2B:
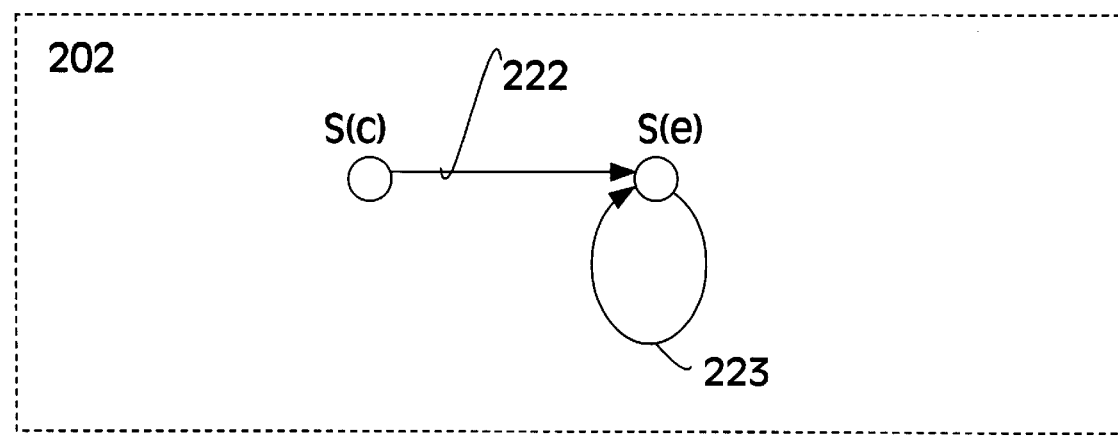
FIG. 2b shows another transition relation built as part of a lazy pre-image computation.

FIG. 2b graphically illustrates a possible transition relation 202 for circuit 101 built as a result of an invocation of the lazy pre-image computation Pre(S(e)) on the state predicate S(e) where e=1. The next state function for variable e is N(e)=e OR c. Therefore, in order for the circuit to reach a state, S(e), where e=1 it must have made transition 222 from a state S(c) where c=1 or it must have made transition 223 from a state S(e) where e=1. Since no other transitions are relevant to reaching state S(e), the lazy pre-image method need not build them. As seen in the above example, this lazy pre-image method potentially reduces the number of transition relation partitions involved and also the sizes of partitions. Therefore computations required to explicitly build a BDD for a desired function may be significantly reduced.

Figure 3A:
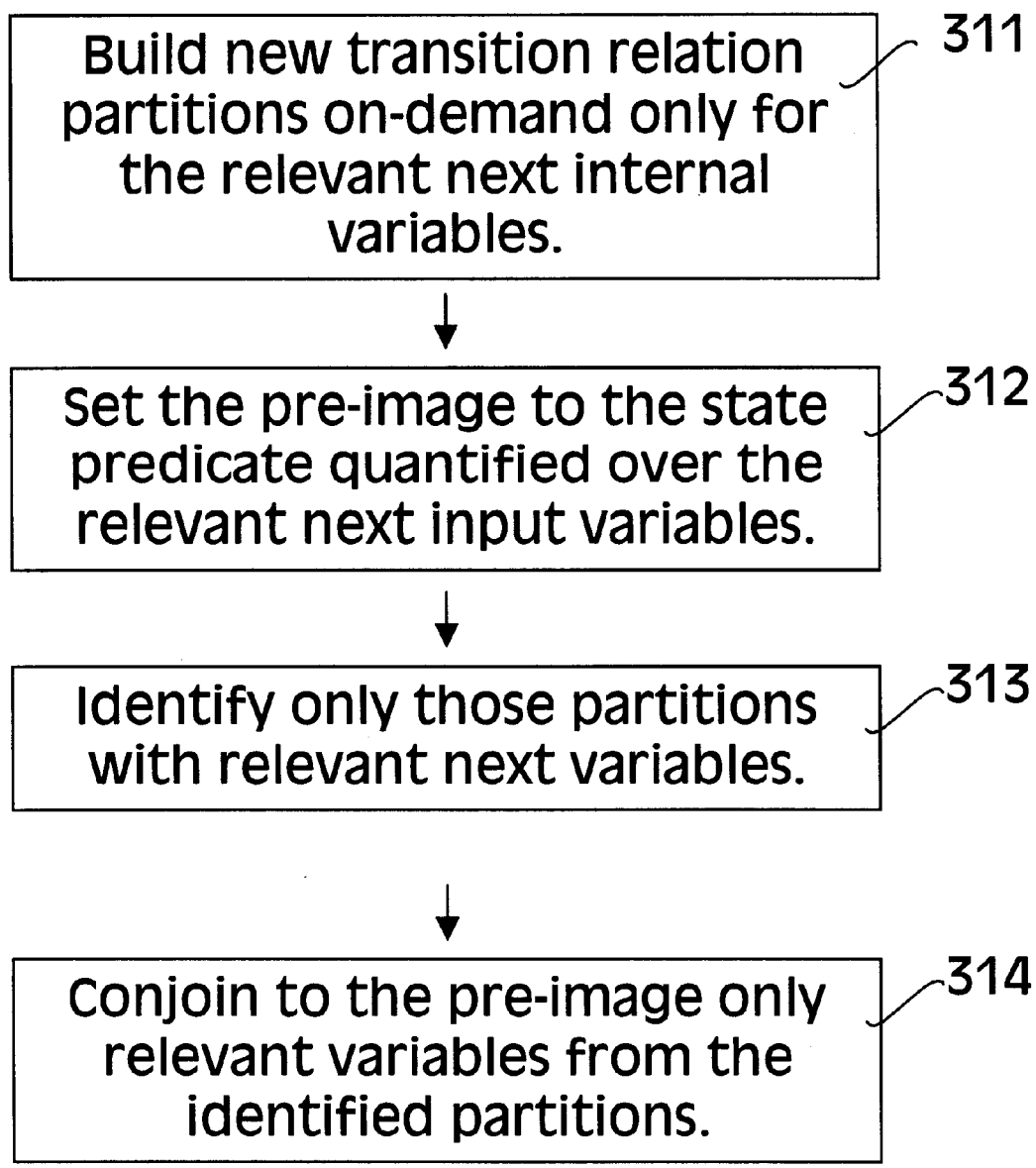
FIG. 3a illustrates one embodiment of a method for performing lazy pre-image computations.

For one embodiment, FIG. 3a illustrates performing a lazy pre-image computation. In processing block 311 transition relation partitions are updated as needed by adding new transition relations for only the relevant next internal variables. In, processing block 312 a pre-image is initialized to the next state predicate of the invocation and existentially quantified over the relevant next input variables. In processing block 313, partitions with relevant next variables are identified. Finally in processing block 314, next state relations for relevant variables from the partitions identified in processing block 313 are conjoined to the pre-image and quantified.

The lazy pre-image method disclosed above provides for greater efficiency and capacity for symbolic model checking operations, particularly on circuits with a large number of variables. In a BDD based implementation, building transition relation partitions only as needed and only for relevant next internal variables is especially beneficial since the next state function for an internal variable is efficiently and implicitly encoded, but a BDD for the function must be explicitly built for symbolic model checking. Explicitly building BDDs unnecessarily may become computationally expensive.

Figure 3B:
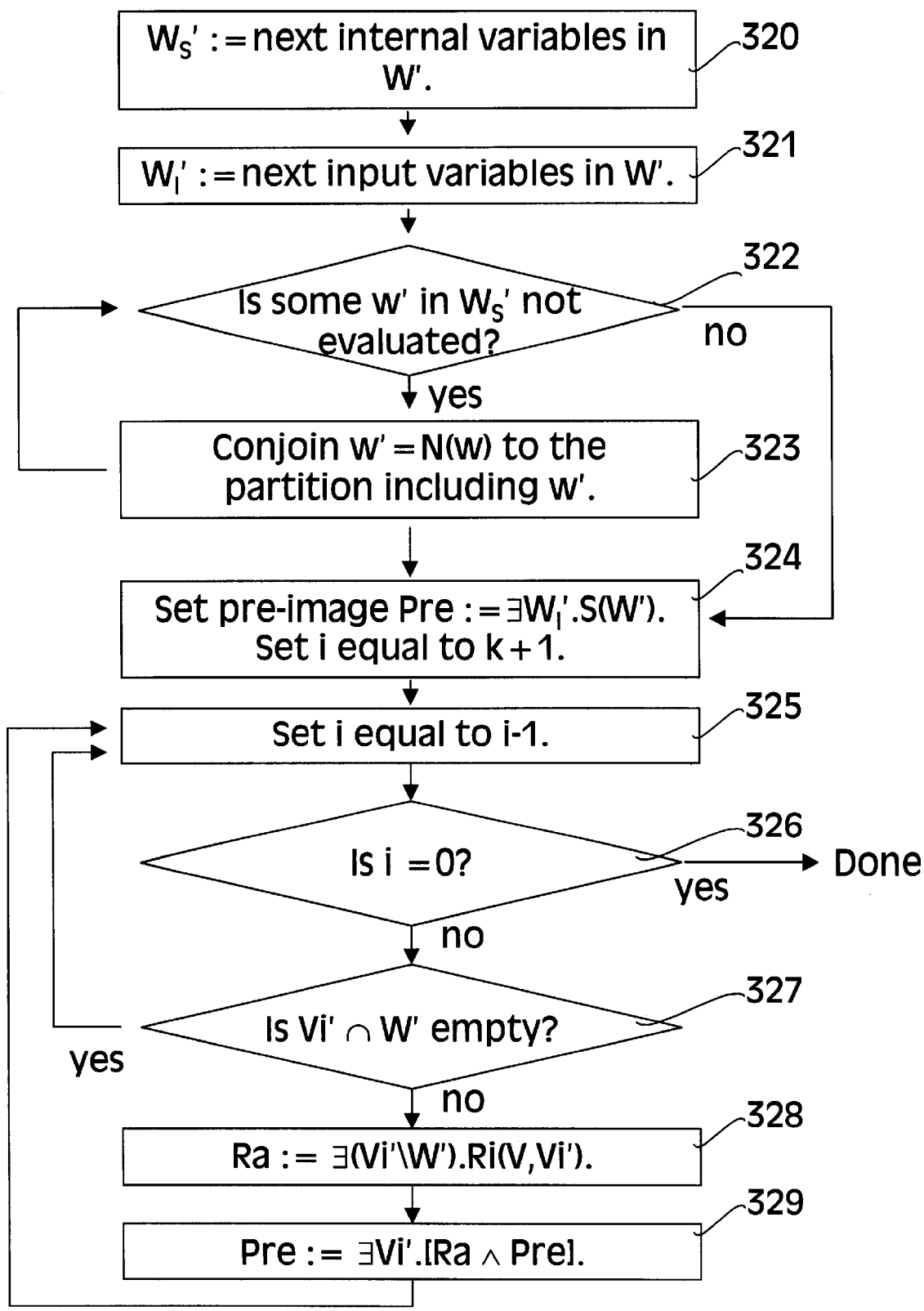
FIG. 3b illustrates one embodiment of a more detailed method for performing lazy pre-image computations.

FIG. 3b details one embodiment of a method for performing a lazy pre-image computation on a state predicate S(W) involving a set W of internal variables and input variables. In processing block 320, $W_S'$ is initialized to be the set of next internal variables in W'. In processing block 321, $W_I'$ is initialized to be the set of next input variables in W'. In processing block 322, the next internal variables are checked to identify some variable w' that has not been evaluated. If one is identified, w'=N(w) is conjoined to the partition including w' and flow returns to processing block 322 to look for more next variables that have not been evaluated. Thus the transition relation partitions are built as needed for the relevant next internal variables. When no more are found, flow proceeds at processing block 324. In processing block 324 the pre-image is initialized to the state predicate existentially quantified for the relevant next input variables and partition counter i is set to k+1. In processing block 325, i is decremented. Then in processing block 326, partition counter i is tested to see if it has reached zero. If partition counter i has not reached zero, in processing block 327 partition Vi' is checked against W' to identify relevant variables. If no relevant variables are found, partition Vi' is skipped and flow proceeds at processing block 325. Otherwise in processing block 328, all next variables in Vi' that are not in W' are existentially quantified out from partition Vi' and the remaining relevant variables are evaluated according to their next state relations and assigned to Ra. Then in processing block 329, Ra is conjoined with the pre-image Pre and flow proceeds with the next i at processing block 325. When i=0 indicating no more partitions remain at processing block 326, the processing terminates and pre-image Pre is complete.

In one embodiment, the lazy pre-image computation disclosed above provides for potential improvements in key model checking techniques. For example one embodiment of a lazy pre-image method provides an efficient general operation that may also be used effectively in performing fixpoint computations.

Figure 4A:
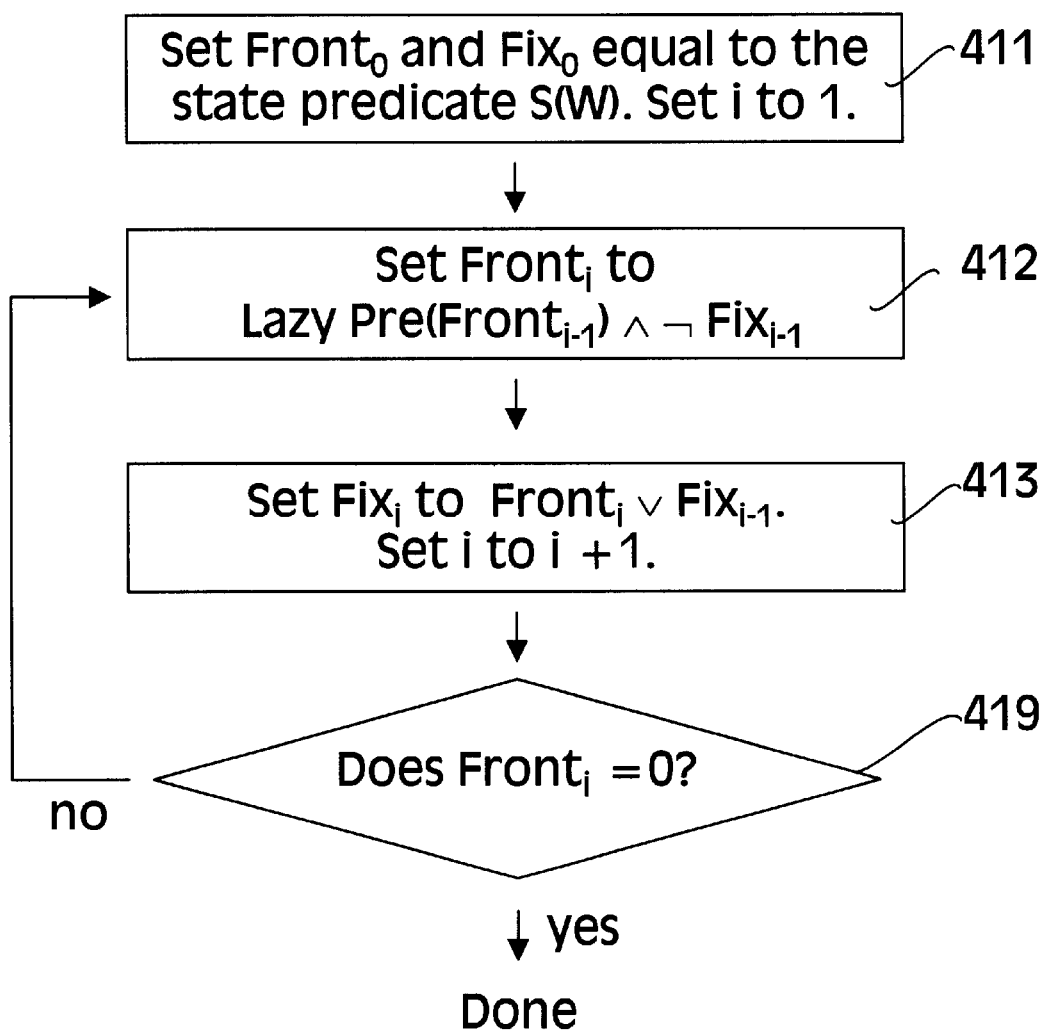
FIG. 4a illustrates one embodiment of a method for computing a fixpoint using lazy pre-image computations.

FIG. 4a illustrates one embodiment of a fixpoint computation method which uses lazy pre-image computations. In processing block 411, a partial fixpoint state predicate, $Fix_0$, and an initial frontier predicate, $Front_0$, are both set to the input predicate S(W), and counter i is initialized to 1. In processing block 412, the new frontier predicate, $Front_i$, is set to the lazy pre-image of the previous frontier predicate, $Front_{i-1}$, intersected with the negated partial fixpoint predicate, $\neg Fix_{i-1}$, in order to exclude any states whose pre-images have already been computed. This computation is expressed symbolically as Pre(Front$_{i-1}$)^¬Fix$_{i-1}$. In processing block 413 a new fixpoint predicate Fix$_i$ is set to the union of the new frontier predicate, Front$_i$, and the previous partial fixpoint predicate, Fix$_{i-1}$. Counter i is then incremented. In processing block 419, Front$_i$, is tested to see if any states from the previous iteration that need to have pre-images computed remain in the frontier. If so, processing beginning at processing block 412 repeats until Front$_i$ is emptied of such states, in which case processing terminates at processing block 419.

FIG. 4b illustrates an example for one embodiment of performing a lazy fixpoint computation for state predicate, S(e), where e=1, on circuit 101. The fixpoint Fix$_0$ predicate 420 for the states reachable to S(e) in zero transitions and the frontier Front$_0$ are initially set to e. Since no pre-image computation is required, no transition relation is built. To compute the fixpoint Fix$_1$ predicate 421 for the states reachable to S(e) in one transition a lazy pre-image of the frontier predicate Front$_0$ is computed and combined with NOT Fix$_0$. Since frontier predicate Front$_0$ only involves signal e, lazy transition relation building only computes a transition relation partition for e, as [N(e)=e OR c]. Lazy pre-image Pre(S(e)) can be computed as previously shown, and the lazy pre-image computation returns e OR c based on the partially computed transition relation. The new frontier predicate Front$_1$ is set to (e OR c) AND NOT e in accordance with processing block 412, which reduces to c AND NOT e. Fixpoint Fix$_1$ predicate 421 for states reachable to S(e) in one transition is set to (c AND NOT e) OR e, which becomes e OR c.

To compute the fixpoint Fix$_2$ predicate 422 for those states reachable to S(e) in two transitions, the lazy pre-image of the frontier predicate Front$_1$ is computed and combined with NOT Fix$_1$. The pre-image is calculated as follows:

$$Pre(c \text{ AND NOT } e) = \exists e', c'.[(e' = N(e)) \text{ AND } (c' = N(c)) \text{ AND }$$
$$S(e', c')].$$
$$= \exists e', c'.[(e' = e \text{ OR } c) \text{ AND }$$
$$(c' = c \text{ AND } a) \text{ AND } (c' \text{ AND NOT } e')].$$
$$= (c \text{ AND } a) \text{ AND NOT } (e \text{ OR } c).$$

Predicate (c AND NOT e) requires lazy transition relation building of the translation relation partition for c, as [N(c)=c AND a]. Lazy pre-image computation returns (c AND a) AND NOT (e OR c) based on the partially computed transition relation. The new frontier predicate Front$_2$ is set to (c AND a) AND NOT (e OR c) in accordance with processing block 412, which reduces to (c AND a AND NOT e AND NOT c)=0. Fixpoint Fix$_2$ Predicate 422 for states reachable to S(e) in two transitions becomes just (e OR c).

Since frontier predicate Front$_2$=0 the lazy fixpoint computation terminates. The transition relations for b, d and f are not needed and therefore they are not built.

It will be appreciated that a symbolic model checking operation may benefit significantly from a reduction in the number of transition relations used to represent a model. A further reduction may be accomplished if for each property to be evaluated, only the necessary portions of the model are represented. For one embodiment of a dynamic transition relation pruning technique, a method is disclosed that improves the efficiency for symbolic model checking computations by pruning transition relations under assumptions dynamically generated from the properties being evaluated, thereby providing means to handle very large scale integrated circuits and other finite state systems of problematic complexity for prior methods.

Figure 5A:
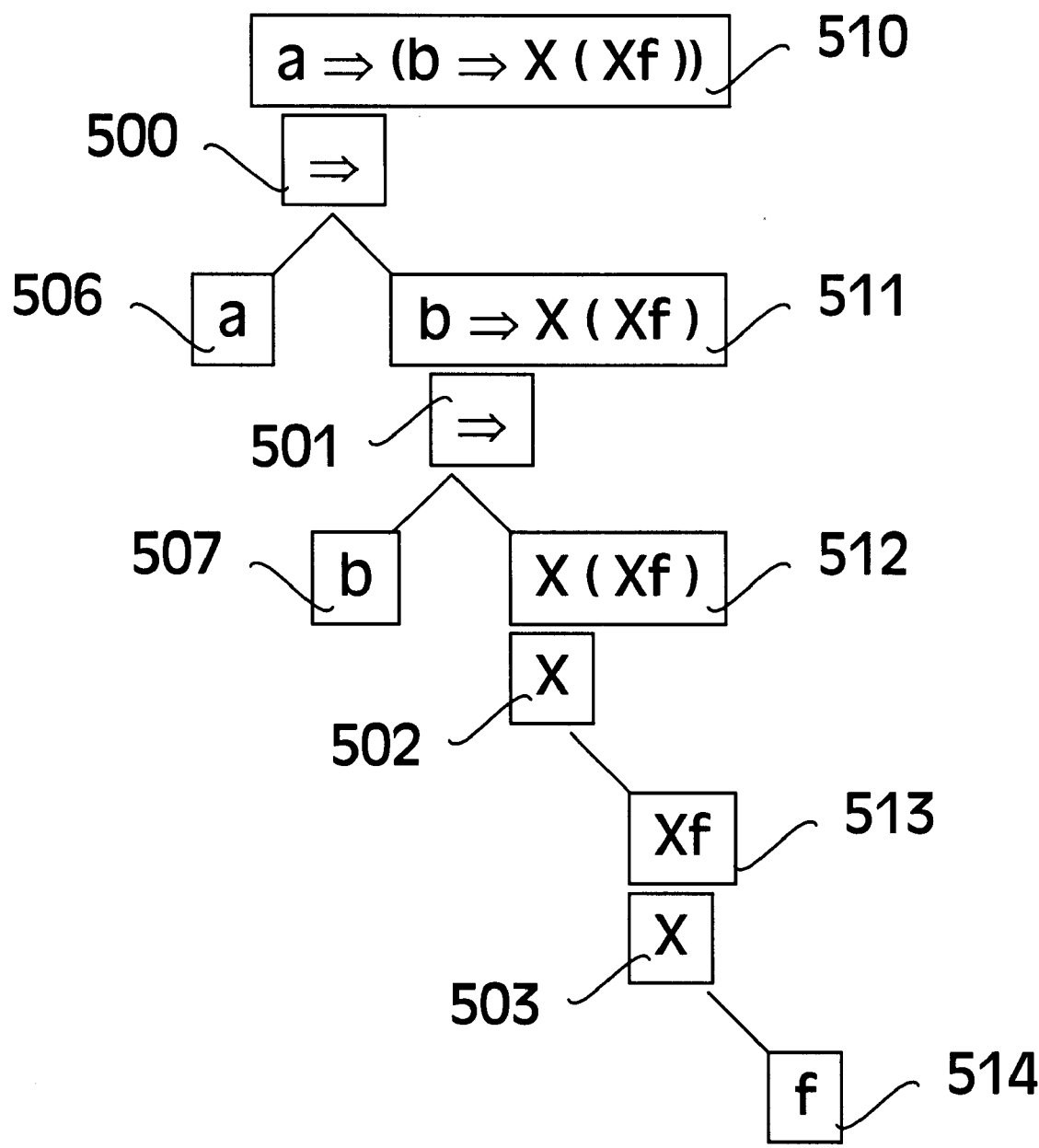
FIG. 5a illustrates a parsing of a property to be evaluated.

FIG. 5a illustrates a parsing of a property 510, a→(b→X (Xf)). At the first stage the property is parsed into a root 500 representing the logical implication operation, a left sub-property 506 representing the variable, a, and a right sub-property 511 representing b→X(Xf). The operator X indicates that its predicate argument holds at the next transition.

At the second stage the sub-property 511 is parsed into a root 501 representing the logical implication operation, a left sub-property 507 representing the variable, b, and a right sub-property 512 representing X(Xf). At the third stage the property is parsed into a root 502 representing the next state operator X, and a right sub-property 513 representing Xf. Finally at the fourth stage the sub-property 513 is parsed into a root 503 representing the next state operator X, and a right sub-property 514 representing f. Given a parsing of the property assumptions may be generated for the sup-properties to be evaluated.

Figure 5B:
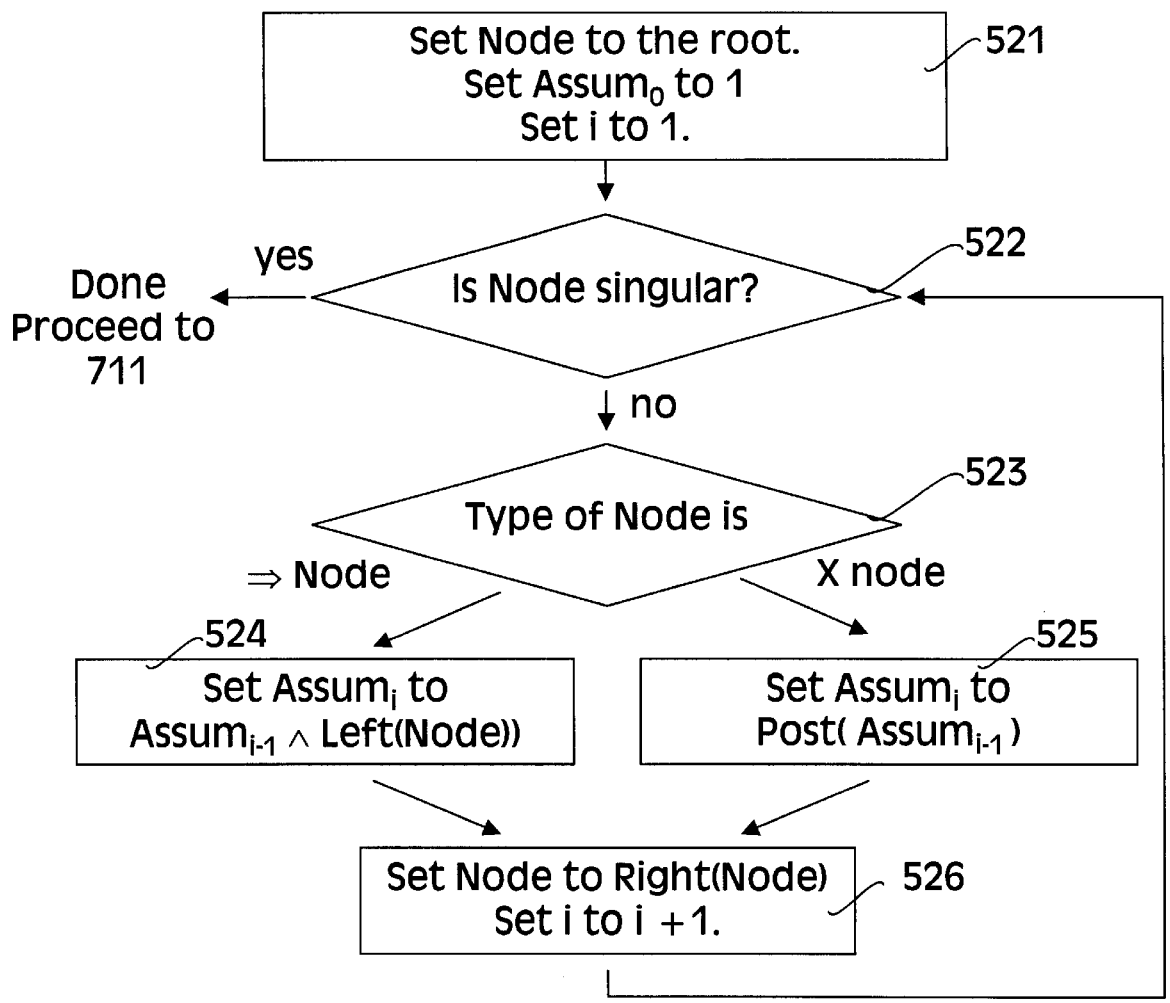
FIG. 5b illustrates one embodiment of a method for producing and propagating assumptions from sub-properties to be evaluated.

FIG. 5b illustrates one embodiment of a method for producing and propagating assumptions from sub-properties to be evaluated. In processing block 521, the assumption for iteration zero, Assum$_0$, is initialized to the value one (true) and Node is set to the root 500 of the property to be evaluated. The iteration counter i is then incremented and processing proceeds to processing block 522. In processing block 522, the Node is tested to see if it consists of a single variable, in which case processing terminates at processing block 522. If not, processing proceeds to processing block 523. In processing block 523 the type of the Node operation is identified. If it is an implication operation processing proceeds at processing block 524. On the other hand, if it is a next state operator X, then processing proceeds to processing block 525.

In processing block 524 the assumption for iteration i, Assum$_i$, is set to the assumption for iteration i−1, Assum$_{i-1}$, combined with the left sub-property of Node using the logical AND operation. In processing block 525 the assumption for iteration i, Assum$_i$, is set to post-image of the assumption for iteration i−1, Assum$_{i-1}$. Processing then proceeds to processing block 526 from processing block 524 or from processing block 525, where Node is set to the right sub-property of Node. The iteration counter i is then incremented and processing proceeds to processing block 522.

FIG. 5c shows an example of producing and propagating assumptions from sub-properties to be evaluated. In iteration zero, assumption 540 is set to the value one and sub-property 530 is set to the state predicate for property to be evaluated (a→(b→X(Xf)) ). In iteration one, assumption 541 is set to a=(1 AND a) in accordance with processing block 524 and sub-property 531 is set to the right sub-property of sub-property 530, b→X(Xf) in accordance with processing block 526. In iteration two, assumption 542 is set to a AND b and sub-property 532 is set to the right sub-property of sub-property 531, X(Xf). In iteration three, assumption 543 is set to Post(a AND b), which may be evaluated as d since N(d) =b, and sub-property 533 is set to the right sub-property of sub-property 532, Xf. In iteration four, assumption 544 is set to Post(Post(a AND b) which may be evaluated to one (true) and sub-property 534 is set to the right sub-property of sub-property 533, f.

The number of variables in a transition relation may be reduced according to a dynamically generated assumption as the transition relation is built. For instance the next state function for a variable f, N(f)=c NAND d may be pruned according to an assumption including (d=1) to N(f)=NOT c.

Figure 6A:
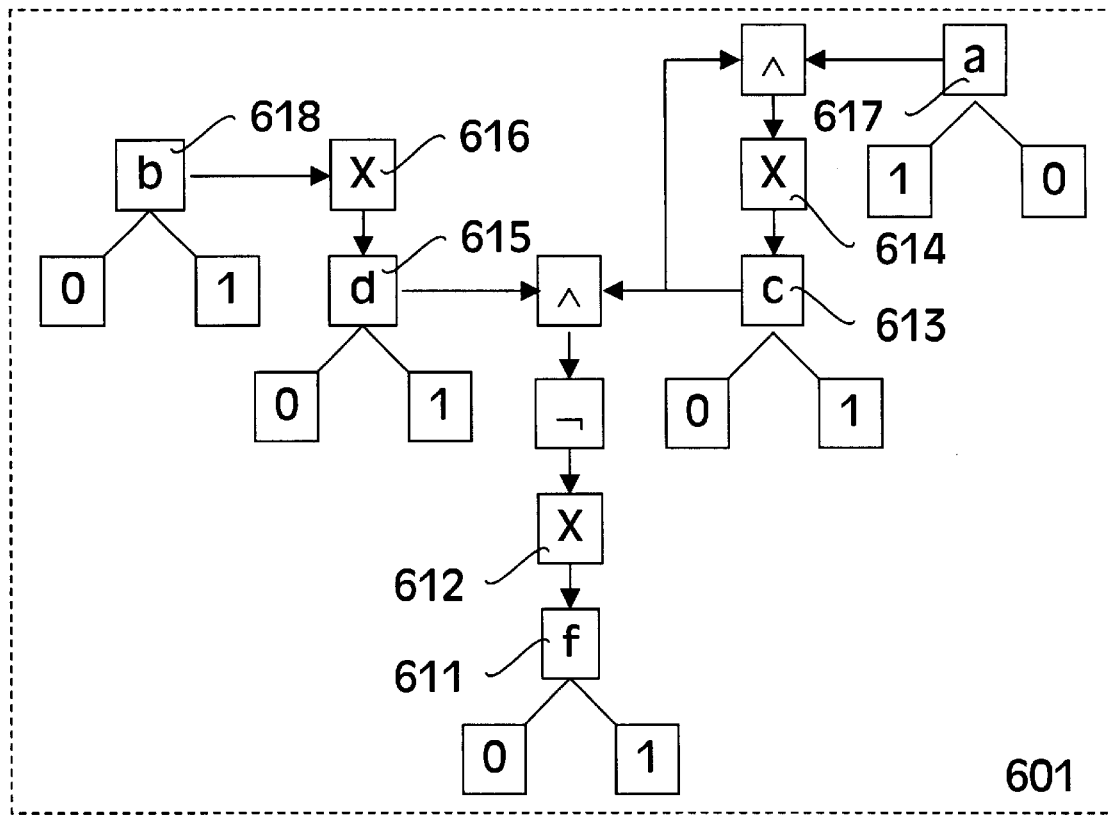
FIG. 6a graphically illustrates the state space of a model with its transition relation built using lazy pre-image computations to evaluate sub-property 530.

FIG. 6a graphically illustrates the state space of a model with a transition relation that was built according to one embodiment of an iterative lazy pre-image computation method to evaluate sub-property 530 or 534. It includes five variables that may be exhaustively searched for an assignment that satisfies the sub-property 530 or 534. These variables are f at block 611, c at block 613, d at block 615, a at block 617 and b at block 618. The three internal variables for which next state functions are included in the transition relation are, N(f) at block 612, N(c) at block 614, and N(d) at block 616. Since the assumptions 540 and 544 are trivial no pruning may be performed on the next state functions.

Figure 6B:
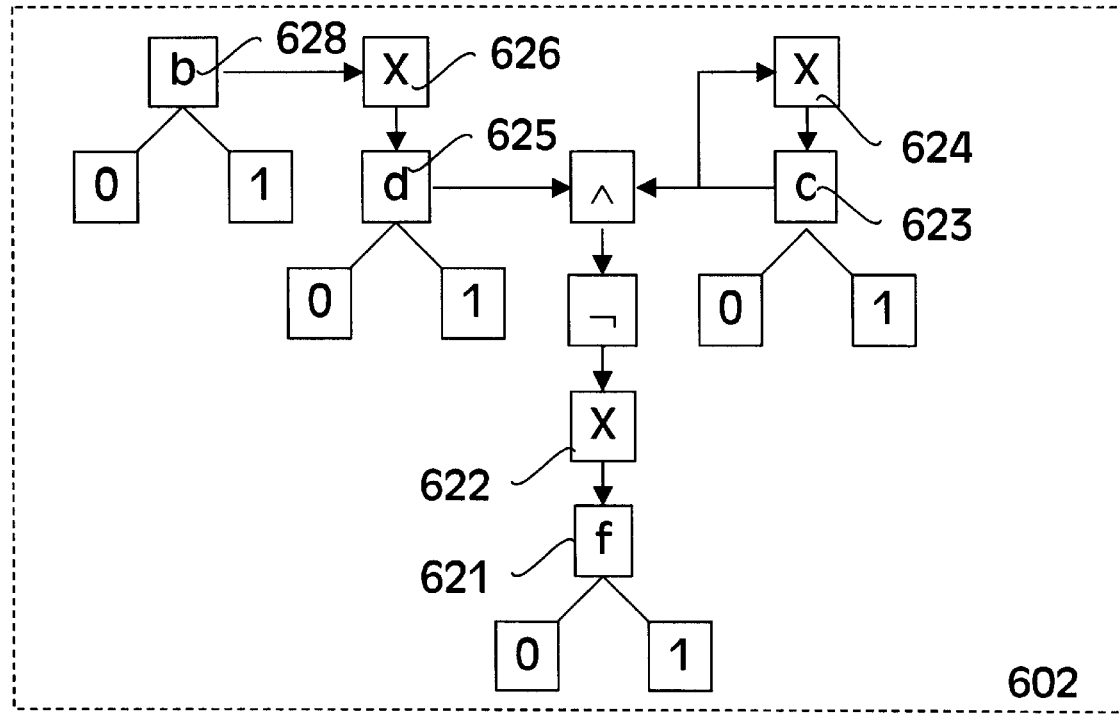
FIG. 6b graphically illustrates the state space of a dynamically pruned model with its transition relation built using lazy pre-image computations to evaluate sub-property 531 under assumption 541.

FIG. 6b graphically illustrates the state space of a dynamically pruned model with a transition relation that was built according to one embodiment of a lazy pre-image computation method to evaluate sub-property 531 under assumption 541. It includes four variables that may be exhaustively searched for an assignment that satisfies the sub-properties 531 or 532. These variables are f at block 621, c at block 623, d at block 625, and b at block 628. The three internal variables for which next state functions are included in the transition relation are, N(f) at block 622, N(c) at block 624, and N(d) at block 626. Since the assumption 541 includes only the input variable, a, pruning of the transition relation may be performed only on the next state function for c, producing N(c)=c instead of N(c)=c AND a.

Figure 6C:
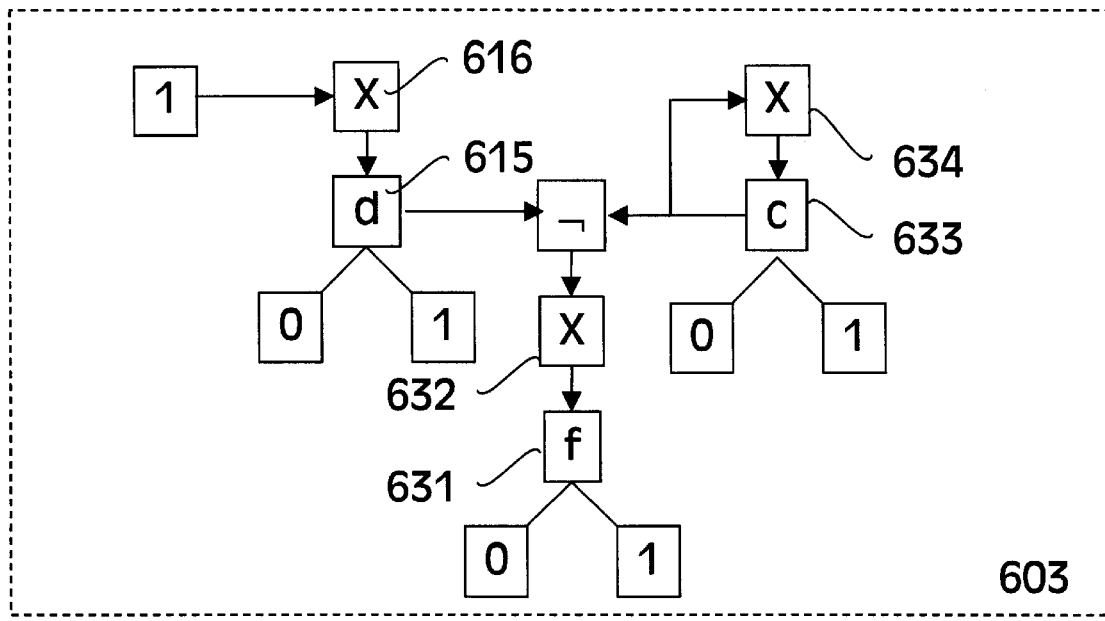
FIG. 6c graphically illustrates the state space of a dynamically pruned model with its transition relation built using lazy pre-image computations to evaluate sub-property 532 under assumption 542.

FIG. 6c graphically illustrates the state space of a dynamically pruned model with a transition relation that was built according to one embodiment of a lazy pre-image computation method to evaluate sub-property 532 under assumption 542. It includes three variables that may be exhaustively searched for an assignment that satisfies the sub-property 531. These variables are f at block 621, c at block 623, d at block 625. The three internal variables for which next state functions are included in the transition relation are, N(f) at block 622, N(c) at block 624, and N(d) at block 626. Since the assumption 541 includes the input variables, a and b, pruning of the transition relation may be performed on the next state function for c, producing N(c)=c instead of N(c)=c AND a and on the next state function for d, producing N(d)=1 instead of N(d)=b.

Figure 6D:
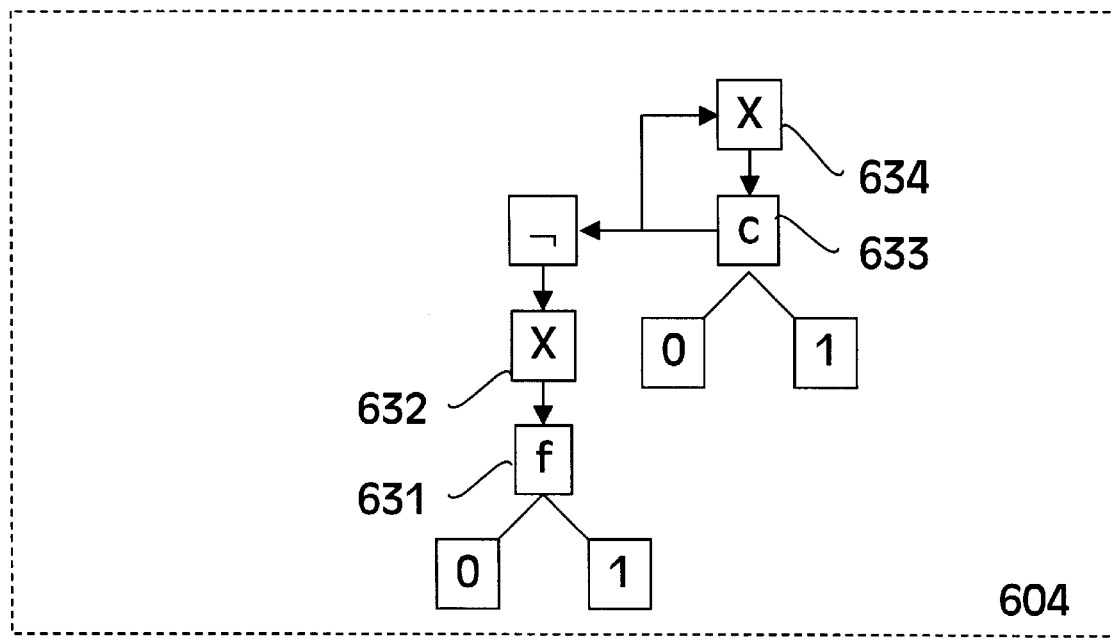
FIG. 6d graphically illustrates the state space of a dynamically pruned model with its transition relation built using lazy pre-image computations to evaluate sub-property 533 under assumption 543.

FIG. 6d graphically illustrates the state space of a dynamically pruned model with a transition relation that was built according to one embodiment of a lazy pre-image computation method to evaluate sub-property 533 under assumption 543. It includes only two variables that may be exhaustively searched for an assignment that satisfies the sub-property 533. These variables are f at block 631 and c at block 633. Both of these internal variables' next state functions are included in the transition relation. They are, N(f) at block 632, and N(c) at block 634. Since the assumption 543 includes the input variable, a, and the internal variable, d, pruning of the transition relation may be performed on the next state functions for c, producing N(c)=c instead of N(c)=c AND a and for f, producing N(f)=NOT c instead of N(f)=c NAND d.

It will be appreciated that a property may be considered a sub-property of itself. It will also be appreciated that an assumption produced from a sub-property to be evaluated may be used to prune a transition relation in a variety of ways. It can be observed in FIG. 6a through FIG. 6e that a significant reduction in state storage may be achieved through dynamic model pruning.

Alternatively the computational complexity of checking the model may be reduced according to the assumption. For instance some model checking methods exhaustively search a state space in order to verify a property or sub-property. If the transition relation is pruned by one or more assignments of variables according to the assumption produced from a sub-property of the property being evaluated, the computational complexity of the search may be significantly reduced.

It will also be appreciated that one may desire to reduce the overall size of the model representation, perhaps at the cost of some addition computational complexity. Alternatively the number of variables in a model or the complexity of evaluating a sub-property may be reduced according to the assumption as the sub-property is being evaluated on the transition relation.

For example, a lazy pre-image of a state predicate S(Xf) AND Assum$_3$ for circuit 101 can be computed:

$$Pre(S(Xf)) \text{ AND } Assum_3 = \exists f'.[(f' = N(f)) \text{ AND } S(f')] \text{ AND}$$
$$Assum_3$$
$$= \exists f'.[(f' = (c \text{ NAND } d)) \text{ AND}$$
$$f'] \text{ AND } Assum_3 = (c \text{ NAND } d) \text{ AND}$$
$$d = 1$$
$$= \text{NOT } c$$

In general each sub-property may need to be evaluated according to its corresponding assumption. This operation may be performed in such a way as to substantially reduce the size of transition relations by pruning next state functions as the transition relations are dynamically built by a lazy pre-image calculation.

Figure 7A:
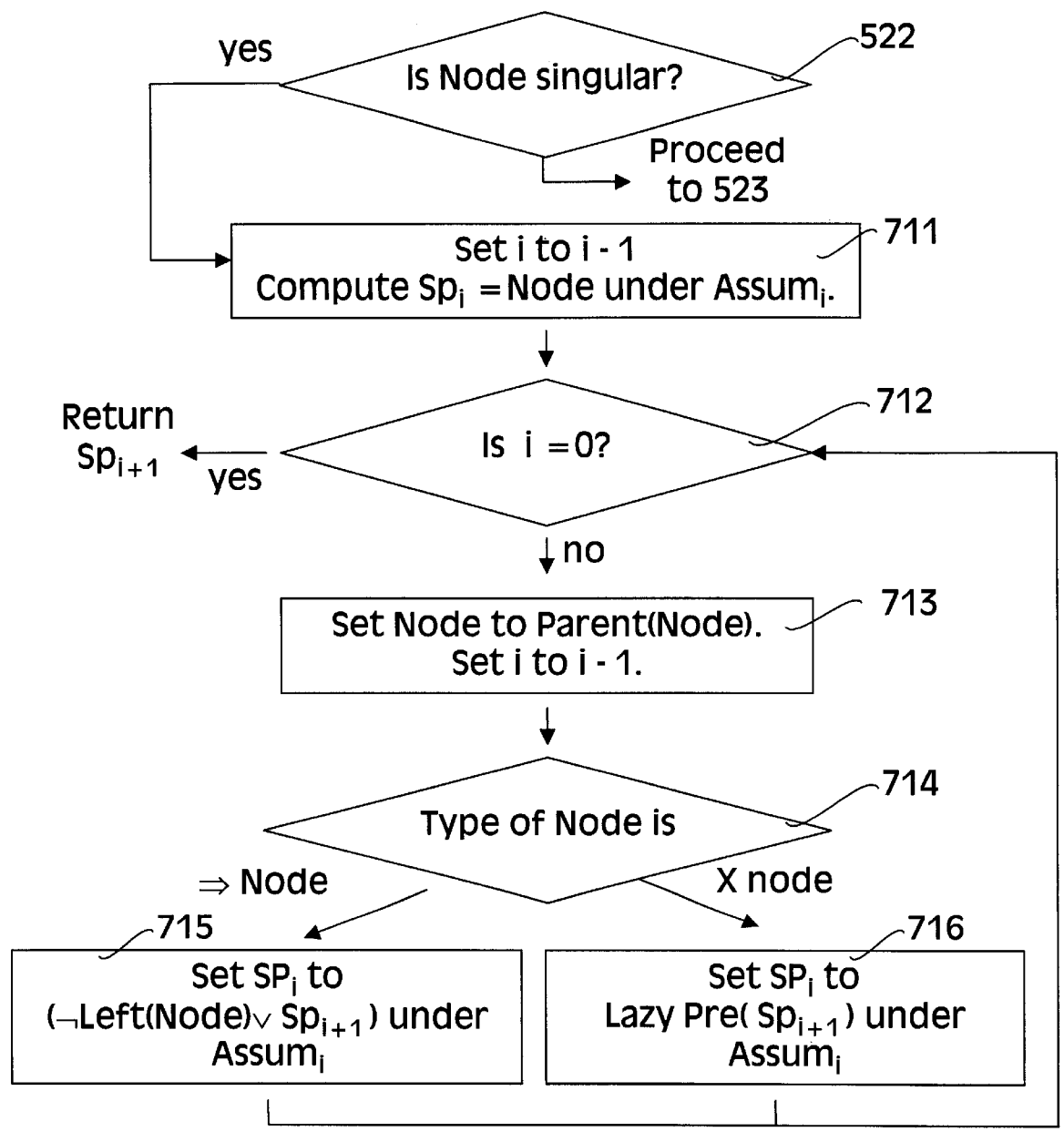
FIG. 7a illustrates one embodiment of a method for dynamically pruning a model by producing and propagating assumptions from sub-properties to be evaluated and pruning the transition relation under the assumptions generated.

FIG. 7a illustrates one embodiment of a method for dynamically pruning a model by producing and propagating assumptions as shown in FIG. 5b from sub-properties to be evaluated and then pruning the transition relation under the assumptions generated. Processing block 711 is entered when a singular Node is identified in processing block 522. In processing block 711, the iteration counter i is decremented and then the sub-property for iteration i, SP$_i$ is computed from the singular Node variable under the assumption for iteration i, Assum$_i$. Processing then proceeds to processing block 712 where the iteration counter is tested. Processing beginning in processing block 713 is repeated until the iteration counter is equal to zero in processing block 712, in which case processing terminates and returns the predicate SP$_i$. In processing block 713 the Node is set to its parent Node and the iteration counter, i, is decremented. Processing then proceeds in processing block 714.

In processing block 714 the type of the Node operation is identified. If it is an implication operation processing proceeds at processing block 715. On the other hand, if it is a next state operator X, then processing proceeds to processing block 716.

In processing block 715 the state predicate for iteration i, SP$_i$, is set to the state predicate for iteration i+1, SP$_{i+1}$, combined with the negated left sub-property of Node using the logical OR operation and evaluated under the assumption Assum$_i$. In processing block 716 the state predicate for iteration i, SP$_i$, is set to lazy pre-image of the state predicate for iteration i+1, SP$_{i+1}$ and evaluated under the assumption Assum$_i$. Processing then proceeds to processing block 712 from processing block 715 or from processing block 716.

FIG. 7b shows an example of dynamically pruning a transition relation as it is built in a lazy pre-image computation according to assumptions generated from sub-properties to be evaluated. In iteration 4, state predicate 724 is set to the singular Node variable, f, and evaluated under the assumption 1 (true) which leaves the predicate unchanged. In iteration 3, state predicate 723 is set to the lazy pre-image of the predicate of the predicate f and evaluated under the assumption, d, which in accordance with processing block 716, reduces the next state function N(f)=c NAND d to N(f)=NOT c. In iteration 2, state predicate 722 is set to the lazy pre-image of the predicate, NOT c, and evaluated under the assumption, a AND b, which in accordance with processing block 716, reduces the next state function N(c)=a AND c to N(c)=c. In iteration 1, state predicate 721 is set to the logical OR combination of predicate, NOT c, and negated left sub-property, b, resulting in (NOT b OR NOT c) and then evaluated under the assumption, a, in accordance with processing block 715, which leaves the predicate unchanged. In iteration 0, state predicate 720 is set to the logical OR combination of predicate, (NOT b OR NOT c), and negated left sub-property, a, resulting in (NOT a OR NOT b OR NOT c) and then evaluated under the assumption, a, in accordance with processing block 715, which leaves the predicate unchanged.

In general, each sub-property may need to evaluated according to its corresponding assumption. If the lazy pre-image computation $Pre(SP_{i+1})$ under the assumption $Assum_i$ is equal to 1 then no succeeding evaluations are needed as each will trivially be satisfied in processing block 715 or processing block 716.

It will be appreciated that the methods herein disclosed or methods substantially similar to those herein disclosed may be implemented in one of many programming languages for performing automated computations including but not limited to lazy pre-image computations, dynamic production and propagation of assumptions, dynamic pruning of transition relations, lazy fixpoint computations using dynamic model pruning, and lazy model checking using dynamic model pruning on high-speed computing devices.

Figure 8:
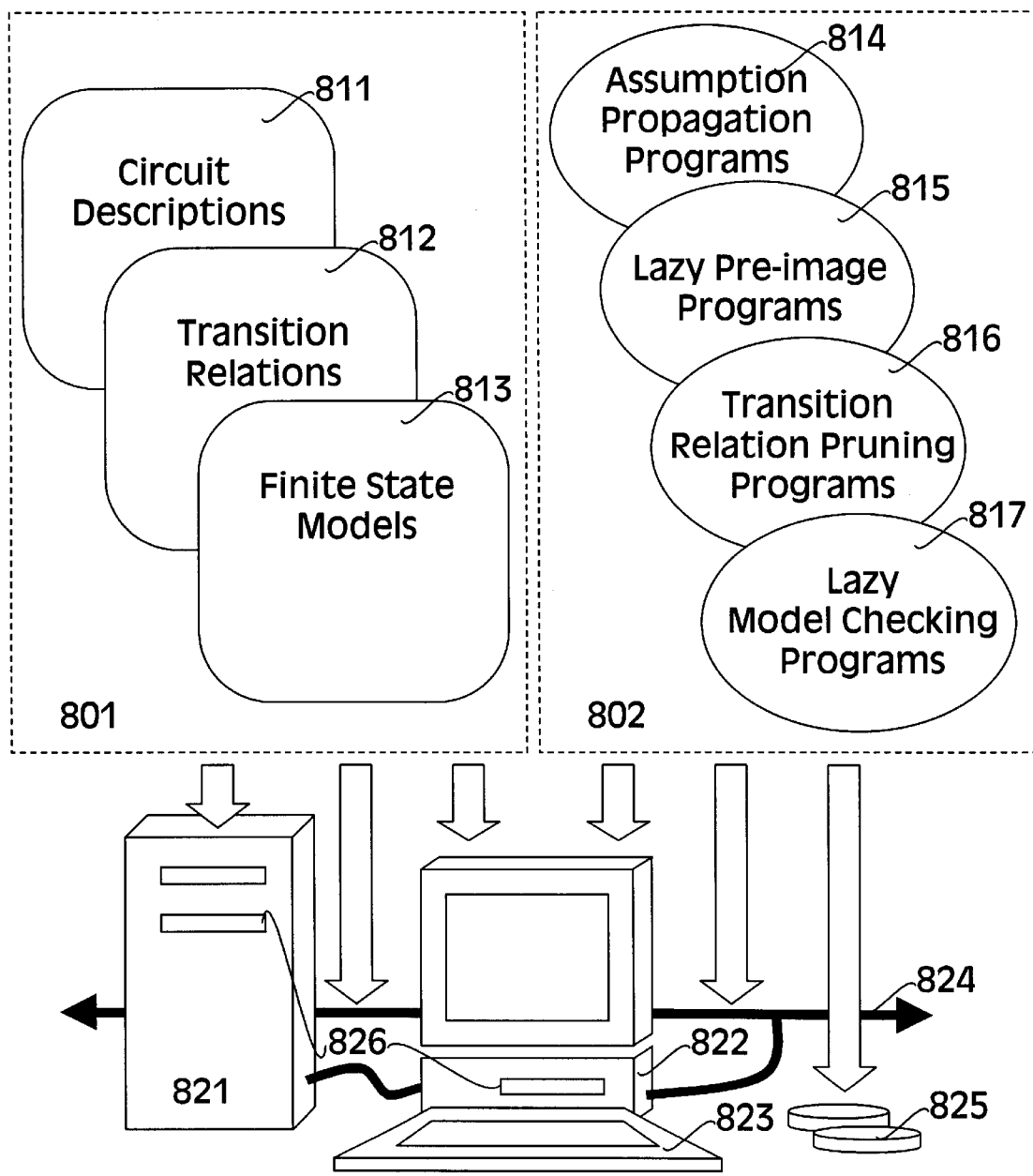
FIG. 8 depicts a computing system for automated lazy symbolic model checking of finite state systems using symbolic variable reduction.

For example, FIG. 8 illustrates a computer system to perform computations, for one such embodiment. Processing device 822 is connectable with various recordable storage media, transmission media and I/O devices to receive data structures and programmed methods. Representative data structures 801 may include circuit descriptions 811, transition relations 812, and finite state models 813. Representative programmed methods 802 may include assumption propagation programs 814, lazy pre-image programs 815, transition relation pruning programs 816, and model checking programs 817. Components of either or both of the data structures and programmed methods may be stored or transmitted on recordable media such as removable storage disks 825, which may be accessed through an access device 826 in processing device 822 or in a storage serving system 821. Storage serving system 821 or processing device 822 may also include other removable storage media or non-removable storage media suitable for storing or transmitting data structures 801 or programmed methods 802. Component data structures and programmed methods may also be stored or transmitted on transmission media such as network 824 for access by processing device 822 or entered by users through I/O device 823. It will be appreciated that systems such as the one illustrated are commonly available and widely used in the art of designing finite state hardware and software systems. It will also be appreciated that the complexity, capabilities, and physical forms of such design systems improves and changes rapidly, and therefore understood that the design system illustrated is by way of example and not limitation. The above description is intended to illustrate preferred embodiments of the present invention. From the discussion above it should also be apparent that the invention can be modified in arrangement and detail by those skilled in the art without departing from the principles of the present invention within the scope of the accompanying claims.

What is claimed is:

1. A computer software product having one or more recordable medium having executable instructions stored thereon which, when executed by a processing device, causes the processing device to:
   generate, from a first property, a first assumption including a first state predicate;
   generate, for a model, a first transition relation that includes the first state predicate;
   reduce the first transition relation according to the first assumption; and
   propagate the first assumption to generate a second assumption according to a second state predicate.

2. The computer software product recited in claim 1 wherein the second property is a sub-property of the first property.

3. The computer software product recited in claim 1 wherein the second property is to be evaluated under the first assumption.

4. The computer software product recited in claim 1 wherein the first assumption is propagated only one transition stage to generate the second assumption.

5. A computer software product having one or more recordable medium having executable instructions stored thereon which, when executed by a processing device, causes the processing device to:
   receive a first state machine property to evaluate;
   generate, from the first state machine property, a first assumption including a first state predicate;
   generate a reduced next state function from a first next state function involving the first state predicate by applying the first assumption;
   produce, for a model, a transition relation that includes the reduced next state function; and
   propagate the first assumption according to a second state machine property to generate a second assumption.

6. The computer software product recited in claim 5 wherein generating a reduced next state function reduces the size of the model.

7. The computer software product recited in claim 5 wherein generating a reduced next state function reduces the computational complexity of evaluating the first property.

8. The computer software product recited in claim 5 wherein generating a reduced next state function reduces the number of variables in the model.

9. The computer software product recited in claim 5 wherein generating a reduced next state function reduces the number of variables in the first transition relation.

10. The computer software product recited in claim 5 wherein the second state machine property is a sub-property of the first state machine property.

11. The computer software product recited in claim 5 wherein the second state machine property is to be evaluated under the first assumption.

12. The computer software product recited in claim 5 wherein the first assumption is propagated only one transition stage to generate the second assumption.

13. A method comprising:
   producing, from a first property, a first assumption including a first state predicate;
   producing a reduced next state function from a first next state function involving the first state predicate by applying the first assumption;

producing, for a model, a transition relation that includes the reduced next state function; and propagating the first assumption according to a second property to generate a second assumption.

14. The method recited in claim 13 wherein producing a reduced next state function reduces the size of the model.

15. The method recited in claim 13 wherein producing a reduced next state function reduces the computational complexity of evaluating the first property.

16. The method recited in claim 13 wherein producing a reduced next state function reduces the number of variables in the model.

17. The method recited in claim 13 wherein producing a reduced next state function reduces the number of variables in the first transition relation.

18. The method recited in claim 13 wherein the second property is a sub-property of the first property.

19. The method recited in claim 13 wherein the second property is to be evaluated under the first assumption.

20. The method recited in claim 13 wherein the first assumption is propagated only one transition stage to generate the second assumption.

21. A method comprising:

producing, from a first property, a first assumption including a first state predicate; and propagating the first assumption according to a second property to generate a second assumption.

22. The method recited in claim 21 wherein the second property is a sub-property of the first property.

23. The method recited in claim 21 wherein the second property is to be evaluated under the first assumption.

24. The method recited in claim 21 wherein the first assumption is propagated only one transition stage to generate the second assumption.

25. The method recited in claim 21 further comprising:

producing a reduced next state function from a first next state function involving the first state predicate by applying the first assumption; and producing, for a model, a transition relation that includes the reduced next state function.

26. The method recited in claim 25 wherein producing a reduced next state function reduces the size of the model.

27. The method recited in claim 25 wherein producing a reduced next state function reduces the computational complexity of evaluating the first property.

28. The method recited in claim 25 wherein producing a reduced next state function reduces the number of variables in the model.

29. The method recited in claim 25 wherein producing a reduced next state function reduces the number of variables in the first transition relation.

30. A verification system comprising:

means for producing, from a first property, a first assumption including a first state predicate;

means for producing a reduced next state function from a first next state function involving the first state predicate by applying the first assumption;

means for propagating the first assumption according to a second property to generate a second assumption; and means for producing, for a model, a transition relation that includes the reduced next state function.

31. The method recited in claim 30 wherein the second property is a sub-property of the fist property.

32. The method recited in claim 31 wherein the first assumption is propagated only one transition stage to generate the second assumption.

33. A verification system comprising:

a recordable medium to store executable instructions;

a processing device to execute executable instruction; and a plurality of executable instructions to cause the processing device to:

produce, from a first property, a first assumption including a first state predicate;

produce, for a model, a first transition relation that includes the first state predicate;

reduce the first transition relation according to the first assumption; and propagate the first assumption to generate a second assumption according to a second state predicate.

34. The computer software product recited in claim 33 wherein the second property is a sub-property of the first property.

* * * * *

UNITED STATES PATENT AND TRADEMARK OFFICE
CERTIFICATE OF CORRECTION

PATENT NO. : 6,643,827 B1  Page 1 of 1
DATED : November 4, 2003
INVENTOR(S) : Yang It is certified that error appears in the above-identified patent and that said Letters Patent is hereby corrected as shown below:

Title page,
Item [56], References Cited, U.S. PATENT DOCUMENTS, insert --

| 5,119,318 A | 06/1992 | Paradies et al. | 395/61 |
| 5,481,717 A | 01/1996 | Gaboury | 395/700 |
| 5,691,925 A | 11/1997 | Hardin et al. | 364/578 |
| 6,341,367 B1 | 01/2002 | Downing | 716/16 |

--.

Column 3,
Line 56, delete "$V=V_S \text{Å} V_I$", insert -- $V=V_S \cup V_I$ --.

Signed and Sealed this

Thirteenth Day of April, 2004

JON W. DUDAS
*Acting Director of the United States Patent and Trademark Office*